United States Patent [19]

Babu et al.

[11] Patent Number: 5,053,104

[45] Date of Patent: Oct. 1, 1991

[54] METHOD OF PLASMA ETCHING A SUBSTRATE WITH A GASEOUS ORGANOHALIDE COMPOUND

[75] Inventors: Suryadevara V. Babu, Potsdam; Joseph G. Hoffarth, Binghamton; Allan R. Knoll, Endicott; Walter E. Mlynko, Vestor, all of N.Y.; John F. Rembetski, Burlington, Vt.; Kenneth D. Mack, Sunnyvale, Calif.

[73] Assignee: International Business Machines Corporation, Armonk, N.Y.

[21] Appl. No.: 443,665

[22] Filed: Nov. 29, 1989

Related U.S. Application Data

[63] Continuation of Ser. No. 12,882, Feb. 15, 1987, abandoned, which is a continuation-in-part of Ser. No. 718,246, Apr. 1, 1985, abandoned.

[51] Int. Cl.$^5$ .............................................. H01L 21/00
[52] U.S. Cl. .................................... 156/643; 156/646; 156/651; 156/668
[58] Field of Search ............... 156/643, 646, 651, 653, 156/668

[56] References Cited

U.S. PATENT DOCUMENTS

| | | | |
|---|---|---|---|
| 4,174,251 | 11/1979 | Paschke | 156/643 |
| 4,487,652 | 12/1984 | Almgren | 156/653 |
| 4,511,430 | 4/1985 | Chen et al. | 156/668 X |
| 4,579,623 | 4/1986 | Suzuki et al. | 156/626 |
| 4,698,128 | 10/1987 | Berglund et al. | 156/643 |

*Primary Examiner*—David A. Simmons
*Assistant Examiner*—Thi Dang
*Attorney, Agent, or Firm*—Perman & Green

[57] ABSTRACT

A plasma etching process is disclosed wherein the substrate to be etched is first exposed to an etchant gas containing a volatile organohalide. When the etch rate is stabilized, the organohalide in the etchant gas is replaced by oxygen whereby the etch rate of the substrate is immediately increased to a substantially higher value. When the above is repeatedly done a substantially higher average etch rate is obtained.

19 Claims, No Drawings

METHOD OF PLASMA ETCHING A SUBSTRATE WITH A GASEOUS ORGANOHALIDE COMPOUND

CROSS REFERENCE TO RELATED APPLICATION

This application is a continuation of U.S. Ser. No. 12,822 filed Feb. 10, 1987, now abandoned which is a continuation-in-part of U.S. Ser. No. 718,246 filed Apr. 1, 1985, now abandoned.

BACKGROUND OF THE INVENTION

1. Field of the Invention

This invention relates to an improvement in plasma etching and particularly to an enhancement in the etch rate of plasma etching processes employing plasmas produced from a gaseous organohalide compound.

2. The Prior Art

In recent years, in the field of surface processing of substrates such as organic polymers and semiconductors, the conventional wet processing method has been extensively replaced by a dry etching processing method. In this so-called dry etching technique, the surface to be etched is exposed to a plasma established by a high frequency glow discharge. For example, U.S. Pat. No. 3,795,557 (Reissue 30,505) discloses exposing a semi-conductor material such as Si, GaAs, GaAsP, InSb having a relatively thin (200 to 10,000 Angstroms) layer of a dielectric material e.g. SiO, $SiO_2$, $Si_3N_4$, either deposited or thermally grown onto the semiconductor, to a gaseous plasma formed from a binary mixture consisting essentially of oxygen and an organohalide compound such as tetrafluoromethane ($CF_4$), the mixture containing 1 to 75 percent oxygen by volume, for an extended period of time. Other patents which contain similar teachings of plasma etching under steady state conditions using organohalide/oxygen mixtures include U.S. Pat. Nos. 4,174,251, 4,180,432, 4,374,699, and 4,487,652. U.S. Pat. Nos. 4,357,203, 4,460,436 and 4,482,427 are exemplary of prior art use of $O_2$ being the sole constituent of a plasma etchant. U.S. Pat. No. 4,487,652 further teaches the use of an oxygen plasma under steady state conditions to clear underlying photoresist and polyimide layers which remain on a substrate after plasma etching of the overlying oxide and a part of the photoresist and polyimide layers with an organohalide/oxygen mixture is completed.

One drawback to the use of organohalide/oxygen mixtures is oftimes the gaseous mixture halogenates the surface of the substrate undergoing plasma etching and forms a halogen contaminated film surface on the substrate. The formation of the halogenated film, or the existence of a halogen contaminated substrate surface, slows the etch rate of the plasma and thereby unduly prolongs the time required for etching (Anand, M. et al, Polymer, 20(2, 507, 1979). Further, the presence of the halogen contaminated surface may also interfere with subsequent processing steps which are intended for the etched substrate, e.g. plating, lamination and adhesion to other later applied layers of organic or inorganic materials.

Another drawback to the use of dry plasma etching has been that for a particular system, i.e. polymer to be etched, etchant gas, and operating conditions, there is a steady state etch rate that limits the maximum etch rate. That is, previous plasma etching operations have been conducted under steady state conditions which has meant that the etch rate was effectively controlled, by the composition of the etchant gas.

Because of the demand for ever-higher speeds of operation and the need for reliably prepared semiconductor components, there has been a considerable effort in the electronics industry to resolve the halogenated surface film problem. We have discovered a plasma etching process employing the use of different gaseous plasma compositions for dry etching which appears to substantially eliminate the etch rate inhibiting halogen surface film previously encountered with organohalide containing plasmas and to produce etch rates substantially greater than the conventional steady state etch rates previously obtained. The plasma etching process of the present invention facilitates, in particular, the process of etching organic polymeric substrates at an extremely rapid rate that is much higher than any encountered in the prior art by using the etching properties of the halogen containing surface layers.

SUMMARY OF THE INVENTION

In accordance with the present invention, there is provided a process for increasing the etch rate of a solid semiconductor or organic polymer substrate in a plasma environment using an organohalide-containing gas which process comprises the steps of first etching a substrate with a gaseous plasma containing an organohalide, interrupting the exposure of the same substrate to the organohalide containing plasma and substituting in place thereof, a gaseous plasma consisting essentially of oxygen.

It has now been discovered that the steady state maximum etch rate for a particular etchant gas may be exceeded for short times by replacing the organohalide-containing etchant gas composition with pure oxygen until such time as the steady state etch rate for pure oxygen is reached. Or more preferably, the average etch rate may be greatly exceeded by operating the plasma etching under non-steady state conditions. Most preferably the non-steady state operation is obtained by altering the use of an organohalide-containing etchant gas with th use of pure oxygen in pulses of the different gases.

As will hereinafter be demonstrated, by substituting a plasma consisting essentially of oxygen for the organohalide containing gas initially used to perform the dry etching process, the etch rate increases almost instantaneously upon such substitution by several orders of magnitude.

DESCRIPTION OF THE PREFERRED EMBODIMENTS

In effecting dry etching in accordance with the practices of the present invention, the initial etchant gas is comprised of a volatile organohalide compound such as $CF_4$, $CCl_4$, $CF_2Cl_2$ and $CFCl_3$ alone or more preferably as a binary mixture with oxygen. When binary mixtures are used as the etchant gas, the mixture generally contains on a volume basis, from about 20 to about 100 percent of the organohalide and from about 80 to about 0 percent by volume oxygen. Preferably, the gaseous binary mixture contains about 20 to about 60 volume percent of the organohalide and about 80 to about 40 volume percent oxygen. Most preferably it contains about 30 to about 60 volume percent organohalide and about 70 to about 40 volume percent oxygen. Carbon tetrafluoride ($CF_4$) is the organohalide gas preferred for use in the initial etching step of the plasma etching process of the present invention.

The substrate receiving the plasma etch treatment of the present invention is continuously etched i.e. the etching process continues during the change of etchant gas. The substrate may be of any material which is conventionally etched using organohalide containing plasmas, as the present process is independent of the substrate material. Thus as for example, organic polymers such as epoxy resin lacquers, polyimides, photoresists, semi-conductor materials such as Si, GaAs, InP, $Si_3N_4$, and $SiO_2$ may all serve as the substrate. The process of the present invention may also be used to treat perfluorinated surfaces, as in textile or synthetic fiber substrates wherein it is necessary to clean the surface to return it to its original properties.

The plasma etching process of the present invention is conveniently conducted in a parallel plate reactor of the type conventionally used for plasma etching of semi-conductor materials. In such a reactor one electrode is powered to between 50 and 500 watts and the other electrode is tuned to about 0 to 100 volts with respect to the ground. The total gas pressure utilized is typically 10 to 500 mTorr and the total gas flow is typically 30 to 300 sccm.

In practicing one embodiment of the plasma etching process of the present invention, the specimen of the substrate material to be etched is mounted on one of the grounded electrodes of the reactor or in between a pair of electrodes. The gas containing the organohalide compound with or without oxygen is introduced into the reactor and a high frequency (RF) power is applied between the power and ground electrodes to produce a plasma between them. The substrate material is exposed to this organohalide containing plasma for about 0.5 to about 5 minutes or until the etch rate has stabilized to its steady state value, e.g. 5 to 1,500 nm/minute as indicated by etch rate measurements, such as laser interferometry. Thereafter the gas atmosphere in the reactor is changed to essentially 100% by volume oxygen by stopping the flow of the organohalide to the reactor and replacing the organohalide flow with oxygen. Upon the replacement of the organohalide with oxygen in the reactor, the etch rate instantaneously increases to 3,000 nm/minute or higher. This enhanced etch rate will generally last for a very short time period, i.e. less than about 2 minutes, e.g. about 10 seconds to about 1 minute and then will stabilize at a considerably lower rate that reflects the steady state etch rate for pure oxygen.

In practicing another embodiment of this invention, the reactor is operated under non-steady state conditions. Such operation may be accomplished by repeatedly varying the etchant gas competition between organohalide-containing and non-organohalide-containing by alternating pulses of the etchant gas compositions. This sequential operation results in a substantially increased overall etch rate by taking advantage of the instantaneously enhanced etch rates which occur when etchant gases are first introduced into a plasma reactor and before they reduce to their lower steady state values. To further explain, pure oxygen will plasma etch an epoxy resin at a steady state value of about 120 nm/min. On the other hand, 60% $CF_4$ in oxygen will etch the same material at a steady state value of about 150 nm/min. with a 10 second residence time in the reactor. But alternation of pulses of 20 seconds of the 60% $CF_4$ in oxygen with 30 seconds of pure oxygen resulted in an overall etch rate of about 1,050 nm/min. The examples below will demonstrate other such increases in the etch rate by this type of non-steady state operation of the plasma reactor.

While not wanting to be bound by any theory, it is believed that non-steady state operation of a plasma reactor by varying the etchant gas composition between one which contains an organohalide and one which does not, produces the observed increased etch rate for the following reasons: the presence of an organohalide in the etchant gas produces an increase in O atoms which are the principle etchant species, but the halide atoms, particularly F atoms, which are present react with active surface sites on the substrate to form a passivating layer of halogenated material which reduces the etch rate to the steady state value; but then a pulse of oxygen (which contains little or preferably no organohalide) causes removal of the passivating halogenated layer from the active surface sites on the substrate and thereby an increase in the etch rate until such time as there are no more halide atoms available to increase the amount of O atoms such that the etch rate has been reduced to the steady state value for oxygen.

Non-steady state operation of the plasma reactor is utilized herein to mean that the reactor is not continuously utilized under steady state conditions during the run. This, of course, does not preclude some operation under steady state conditions. However, the greatest increase in etch rate has been observed when there is essentially non-steady state operation throughout the run.

In the obtainment of non-steady state operation by the varying of the etchant gas composition, the residence time of the reactor as well as the different pulse times for the etchant gases and the particular gas compositions to be utilized must be determined by routine experimentation to obtain a maximum etch rate. The residence time for a reactor is the time for a gas to pass through the reactor and is dependent upon the size of the reactor as well as the flow rate of the etchant gases. Generally the residence time will be on the order of about 1 to about 30 seconds, preferably about 3 to about 20 seconds. The pulse time for the organohalide-containing etchant gas is normally on the order of about 5 to about 60 seconds, preferably about 15 to 30 seconds, depending upon the organohalide content. Generally, the higher the organohalide concentration, the shorter the pulse time until the undesirable steady state operation and lower etch rate occur. The pulse time for the essentially pure oxygen gas is usually on the order of about 5 to about 75 seconds, preferably about 15 to about 45 seconds. Generally, the longer the pure oxygen pulse time, the higher the etch rate until a maximum is reached after which the undesirable steady state operation and lower etch rate occur. The organohalide-containing gas composition is as stated above with the most preferable composition being about 25 to 45% by volume $CF_4$ and 75 to 55% by volume $O_2$.

The overall operation of the plasma reactor is under conventional conditions as detailed above for the first embodiment, and thus is not repeated here.

These procedures are applicable when the etching is accomplished in the plasma reactor i.e. in the plasma mode, in the reaction ion mode or in a floating substrate mode.

The following Examples further illustrate the various embodiments of this invention, it being understood that the invention is in no way intended to be limited to the details described therein.

EXAMPLE I

A series of 50–70 um thick epoxy resin coated silicon coupons were utilized as substrates. Each coupon to be etched was placed on the lower electrode of a parallel electrode plasma etching reactor. The upper electrode was RF powered and the lower electrode was either grounded or maintained at an arbitrary floating potential. The input RF power was 400 watts and the pressure during etching was 100 mTorr. The total gas flow averaged about 60 sccm. Etching was initially carried out using varying percent volume ratios of $CF_4$ and $O_2$. Etch rates were measured simultaneously by laser interferometry. After the etch rate of the epoxy resin coated coupon settled at its steady state value which normally occurred in about 0.5 to about 5.0 minutes after turning on the RF power to the etchant gas filled reactor, the flow of $CF_4$ gas to the reactor was interrupted and replaced with $O_2$ gas while the RF power was continued. Upon replacement of the $CF_4/O_2$ etching gas mixture with 100 volume percent $O_2$, there was an immediate increase in the etch rate. Maximum etch rates, with 100 volume percent $O_2$ atmosphere were achieved within 15–25 seconds. Thereafter the etch rates declined rapidly and reached a stabilized etch rate of about 300–500 nm/minute (The steady state value for $O_2$), at which time the etching process was terminated.

The etch rates of the epoxy resin coated coupons when first exposed to a $CF_4/O_2$ etching gas mixture and the maximum rates measured when the gas mixture was replaced by 100 volume percent $O_2$ are summarized in the Table I below:

TABLE I

| Initial Etch Gas Composition (volume %) | Epoxy Etch Rate (nm/min) | Maximum Etch Rate When Gas Mixture Was Replaced by $O_2$ (nm/min) |
| --- | --- | --- |
| 40% $O_2$, 60% $CF_4$ | 8.5 | 2,900 |
| 60% $O_2$, 40% $CF_4$ | 32 | 13,000 |
| 70% $O_2$, 30% $CF_4$ | 700 | 10,500 |

By reference to the data recorded in the Table I, it is immediately apparent that the replacement of the $CF_4/O_2$ gas mixture with $O_2$ unexpectedly results in a dramatic increase in etch rates which is 15–400 times greater than the etch rate previously achieved with the $CF_4/O_2$ gas mixture.

EXAMPLE II

Etching of a series of epoxy resin coated silicon wafers was performed using a Branson/IPC 7415-C plasma reactor which contained 10 reaction cells, though only cell 5 was utilized to evaluate the etching rates. The feed gas mixture entered the reactor through a single small inlet located at the top of the reactor and at one end. Reaction product and unreacted feed gases were exhausted through a large vacuum port at the opposite end of the reactor. Each wafer being etched was coated with about 15 microns of a commercially used printed circuit board epoxy resin and was mounted on a carrier board which was placed near to the powered electrode. One of the wafers was placed near the gas inlet of the reactor and one was put close to the gas exhaust (except for the 10 second residence test in which only the inlet sample was used).

The input RF power was 3,500 watts. The pressure during etching was 200 millitorr though the reactor was pumped down to 50 millitorr before the start of the gas flow. The gas flow was commenced and about 20 seconds later the RF power was switched on and plasma established. Gas flows of 2,000, 600 and 300 sccm were used which correspond to average residence times of 3, 10 and 20 seconds.

In the steady state runs specified in Table II below, the reactor was allowed to run for 5, 10 or 15 minutes at the specified constant volume ratio of $CF_4$ and $O_2$.

In the non-steady state pulsed runs specified in Tables III–V below, the feed gas was periodically switched between two channels, one set at 60% $CF_4$/40% $O_2$ and the other set for pure $O_2$. Although switching between feed gas channels was instantaneous, the control valves took about 5–8 seconds to respond to the change. This time lag resulted in the pulses being shifted in time but not in duration. In all of these runs the initial pulse was with the $CF_4/O_2$ mixture.

All of the etch rates in Tables II–V were determined by measuring the initial thickness of the epoxy film and the thickness of the etched film with a Dektak profilometer, and then dividing the difference of the thicknesses by the process time during which RF power was maintained. The operating conditions and the etch rates that occurred are given in the tables.

TABLE II

Steady State Etch Rate

| Composition (%$CF_4$, balance $O_2$) | Residence Time (sec) | Etch Rate (nm/min) |
| --- | --- | --- |
| 0 | 3 | 90 |
| 60 | 3 | 330 |
| 100 | 3 | 20 |
| 0 | 10 | 120 |
| 60 | 10 | 150 |
| 100 | 10 | 10 |
| 0 | 20 | 90 |
| 60 | 20 | 170 |
| 100 | 20 | 30 |

TABLE III

Non-Study State Etch Rate
10 Second Residence Time

| Pulse $CF_4/O_2$ (sec) | Pulse $O_2$ (sec) | Etch Rate (nm/min) |
| --- | --- | --- |
| 15 | 5 | 450 |
| 15 | 15 | 900 |
| 15 | 20 | 1000 |
| 15 | 30 | 1050 |
| 15 | 40 | 970 |
| 15 | 50 | 750 |
| 20 | 5 | 390 |
| 20 | 15 | 790 |
| 20 | 20 | 950 |
| 20 | 30 | 1050 |
| 20 | 40 | 1030 |
| 20 | 50 | 880 |
| 30 | 5 | 320 |
| 30 | 15 | 650 |
| 30 | 30 | 940 |
| 30 | 40 | 1030 |
| 30 | 50 | 1020 |
| 30 | 60 | 820 |

TABLE IV

Non-Steady State Etch Rate
3 Second Residence Time

| Pulse $CF_4/O_2$ (sec) | Pulse $O_2$ (sec) | Etch Rate Inlet | (nm/min) Outlet |
| --- | --- | --- | --- |
| 20 | 5 | 670 | 690 |
| 20 | 10 | 720 | 1010 |
| 20 | 15 | 800 | 1120 |
| 20 | 20 | 720 | 1150 |
| 20 | 25 | 620 | 1010 |

TABLE IV-continued

| | Non-Steady State Etch Rate 3 Second Residence Time | | |
|---|---|---|---|
| Pulse CF$_4$/O$_2$ (sec) | Pulse O$_2$ (sec) | Etch Rate Inlet | (nm/min) Outlet |
| 20 | 30 | 580 | 870 |
| 30 | 5 | 530 | 690 |
| 30 | 10 | 800 | 970 |
| 30 | 15 | 850 | 1360 |
| 30 | 20 | 950 | 1430 |
| 30 | 25 | 860 | 1430 |
| 30 | 30 | 750 | 1240 |

TABLE V

| | Non-Steady State Etch Rate 20 Second Residence Time | | |
|---|---|---|---|
| Pulse CF$_4$/O$_2$ (sec) | Pulse O$_2$ (sec) | Etch Rate Inlet | (nm/min) Outlet |
| 20 | 10 | 290 | 230 |
| 20 | 20 | 400 | 350 |
| 20 | 30 | 600 | 580 |
| 20 | 40 | 710 | 680 |
| 20 | 50 | 740 | 710 |
| 20 | 60 | 720 | 640 |
| 30 | 10 | 290 | 240 |
| 30 | 20 | 420 | 380 |
| 30 | 30 | 450 | 400 |
| 30 | 40 | 500 | 440 |
| 30 | 50 | 570 | 550 |
| 30 | 60 | 600 | 490 |

The steady state etch rate data in Table II is presented to provide a basis for comparison with the non-steady state results in Tables III-V. As is readily apparent, the use of non-steady state conditions results in greatly increased etch rates as compared to conventional steady state operation.

A review of the non-steady state data indicates that for a given pulse time of CF$_4$/O$_2$ the average etch rate increases as the pulse time of the O$_2$ pulse increases until a maximum is reached and then the rate declines. This result can be explained in terms of the effect of fluorination on the overall etch rate. For small oxygen pulse times, not enough oxygen is available to react with all the active surface sites created by the CF$_4$/O$_2$ pulse. Also, even though the feed concentration changes quickly, the concentration within the reactor changes more slowly. As a result, for the small O$_2$ pulse times, there would appear to be a significant amount of CF$_4$ still present in the reaction chamber and surface fluorination is still occurring which decreases the etch rate. As the oxygen pulse time is increased, more and more of the active sites are consumed by O atoms during each pulse and consequently, the etch rate increases. This is true only up to a certain point where a maximum occurs. As the oxygen pulse time gets longer and longer, the etch rate decreases and approaches the steady state value which is observed for pure oxygen.

In Table V for a 30 second pulse of CF$_4$/O$_2$, there was no observed maximum etch rate with O$_2$ pulses of up to 60 seconds. Thus it is clear that a 60 second O$_2$ pulse was not sufficient to consume all of the active sites created by the 30 second pulse of CF$_4$/O$_2$ for the 20 second residence time.

It should also be noted that there was a difference in etch rate behavior between the inlet and the outlet for the 3 second residence time as compared to the 20 second residence time. For the 3 second residence the rate at the outlet is significantly higher than at the inlet while for the 20 second residence the results are essentially equal.

While specific components of the present system are defined above, many other variables may be introduced which may in any way affect, enhance, or otherwise improve the system of the present invention. These are intended to be included herein.

Although variations are shown in the present application, many modifications and ramifications will occur to those skilled in the art upon a reading of the present disclosure. These, too, are intended to be included herein.

We claim:

1. A method for increasing the etch rate of a single organic polymeric substrate material which is etchable by plasma etching using an organohalide-containing etchant gas, which comprises the steps of (1) continuously subjecting said single substrate material to high frequency energy, (2) introducing an organohalide-containing etchant gas to said high frequency energy to create an etchant plasma of said gas to etch said single substrate material through a portion of its thickness, (3) replacing said organohalide-containing etchant gas with a non-organohalide-containing etchant gas while continuing said high frequency energy, in order to create an etchant plasma of gas which produces a substantially increased etch rate of said single substrate material, and (4) repeating steps (2) and (3) until the single substrate material is completely etched.

2. The method of claim 1 wherein the non-organohalide-containing etchant gas is oxygen.

3. The method of claim 2 wherein the organohalide-containing etchant gas comprises a mixture of an organofluoride and oxygen.

4. The method of claim 3 said etchant gases comprise the organohalide-containing etchant gas is a mixture of CF$_4$ and O$_2$.

5. The method of claim 4 wherein the etchant gas contains on a volume basis about 25 to about 45 percent CF$_4$ and about 75 to about 55 percent O$_2$.

6. The method of claim 3 wherein timed pulses of the organofluoride/oxygen mixture are alternated with timed pulses of oxygen gas.

7. The method of claim 6 wherein the timed pulses of oxygen gas are for such a period of time as to maximize the etch rate.

8. The method of claim 1 wherein the organohalide is an organofluoride.

9. The method of claim 8 wherein the organofluoride is CF$_4$.

10. The method of claim 1 wherein said etchant gases are introduced in the form of timed pulses of about 5 to about 60 seconds of the organohalide containing etchant gas alternated with timed pulses of about 5 to about 75 seconds of oxygen gas.

11. The method of claim 10 wherein the timed pulses of organohalide-containing etchant gas are for about 15 to about 30 seconds.

12. The method of claim 1 wherein the substrate material is a semiconductor material.

13. The method of claim 1 wherein the substrate is a dielectric material which has been deposited on a semiconductor material.

14. The method of claim 1 wherein the organohalide-containing etchant gas is a mixture of CF$_4$ and O$_2$.

15. The method of claim 1 wherein the etchant gas contains on a volume basis about 20 to about 60 percent CF$_4$ and about 80 to about 40 percent O$_2$.

16. The method of claim 1 wherein the substrate is etched with the organohalide-containing etchant gas for about 0.5 to about 5.0 minutes and then etched with the oxygen gas for less than about 2 minutes.

17. The method of claim 1 wherein the substrate is a semiconductor material.

18. The method of claim 1 wherein the substrate is a dielectric material which has been deposited on a semiconductor material.

19. The method of claim 1 in which step (2) is continued until the rate of etching of said substrate decreases to a steady rate.

* * * * *